(12) United States Patent
Salle et al.

(10) Patent No.: US 10,236,898 B2
(45) Date of Patent: Mar. 19, 2019

(54) DIGITAL SYNTHESIZER, COMMUNICATION UNIT AND METHOD THEREFOR

(71) Applicant: NXP USA, Inc., Austin, TX (US)

(72) Inventors: Didier Salle, Toulouse (FR); Olivier Vincent Doare, La Salvetat St Gilles (FR); Birama Goumballa, Larra (FR); Cristian Pavao Moreira, Frouzins (FR)

(73) Assignee: NXP USA, Inc., Austin, TX (US)

( * ) Notice: Subject to any disclaimer, the term of this patent is extended or adjusted under 35 U.S.C. 154(b) by 40 days.

(21) Appl. No.: 15/660,649

(22) Filed: Jul. 26, 2017

(65) Prior Publication Data
US 2018/0123605 A1 May 3, 2018

(30) Foreign Application Priority Data
Oct. 27, 2016 (EP) .................................... 16306408

(51) Int. Cl.
| | |
|---|---|
| *H03L 7/06* | (2006.01) |
| *H03L 7/099* | (2006.01) |
| *H03K 4/06* | (2006.01) |
| *H03L 7/085* | (2006.01) |
| *G01S 13/34* | (2006.01) |

(Continued)

(52) U.S. Cl.
CPC .......... *H03L 7/0992* (2013.01); *G01S 13/343* (2013.01); *H03C 3/0908* (2013.01); *H03K 4/06* (2013.01); *H03L 7/08* (2013.01); *H03L 7/085* (2013.01); *H03L 7/093* (2013.01); *H03L 7/16* (2013.01); *G01S 7/35* (2013.01); *H03L 2207/50* (2013.01)

(58) Field of Classification Search
CPC ......... H03L 7/0992; H03L 7/085; H03L 7/16; H03L 7/08; H03L 7/093; H03L 2207/50; G01S 13/343; G01S 7/35; H03K 4/06; H03C 3/0908
USPC .................................................. 327/149–159
See application file for complete search history.

(56) References Cited

U.S. PATENT DOCUMENTS 6,809,598 B1 * 10/2004 Staszewski .......... H03C 3/0925
327/156
7,466,207 B2   12/2008 Staszewski et al.
(Continued)

OTHER PUBLICATIONS

Lou et al., "An Ultra-wideband Low-power ADPLL Chirp Synthesizer with Adaptive Loop Bandwidth in 65nm CMOS," 2016 IEEE Radio Frequency Integrated Circuits Symposium, 4 pages.

*Primary Examiner* — Ryan Jager

(57) ABSTRACT

A digital synthesizer is described that comprises: a digitally controlled oscillator, DCO; a feedback loop; a ramp generator configured to generate a signal of frequency control words, FCW, that describes a desired frequency modulated continuous wave; and a phase comparator configured to compare a phase of the FCW output from the ramp generator and a signal fed back from the DCO via the feedback loop and output a N-bit oscillator control signal. The digital synthesizer comprises a gain circuit coupled to a multiplier located between the ramp generator and the DCO and configured to apply a frequency-dependent gain signal to the N-bit oscillator control signal to maintain an open loop gain of the all-digital phase locked loop, ADPLL, and a PLL loop bandwidth that is substantially constant across a frequency modulation bandwidth.

14 Claims, 5 Drawing Sheets

(51) Int. Cl.
  *H03C 3/09* (2006.01)
  *H03L 7/08* (2006.01)
  *H03L 7/093* (2006.01)
  *H03L 7/16* (2006.01)
  *G01S 7/35* (2006.01)

(56) References Cited

U.S. PATENT DOCUMENTS

| | | | | |
|---|---|---|---|---|
| 7,570,182 B2* | 8/2009 | Sheba | ................... | G04F 10/005 |
| | | | | 341/118 |
| 7,817,747 B2* | 10/2010 | Waheed | ................... | H03C 5/00 |
| | | | | 375/298 |
| 7,983,375 B2* | 7/2011 | Dulger | ................. | H03L 7/1806 |
| | | | | 375/376 |
| 8,000,428 B2* | 8/2011 | Staszewski | ............. | H03L 7/085 |
| | | | | 375/362 |
| 8,321,489 B2* | 11/2012 | Staszewski | ......... | G06F 9/30032 |
| | | | | 708/300 |
| 8,937,572 B2* | 1/2015 | Kobayashi | ............ | G01S 13/343 |
| | | | | 331/25 |
| 2008/0315928 A1* | 12/2008 | Waheed | ................ | G04F 10/005 |
| | | | | 327/159 |
| 2010/0245160 A1 | 9/2010 | Sakurai et al. | | |
| 2011/0227785 A1 | 9/2011 | Sakurai | | |
| 2012/0161832 A1* | 6/2012 | Lee | ....................... | H03L 7/0802 |
| | | | | 327/156 |
| 2012/0319889 A1* | 12/2012 | Kobayashi | ............ | G01S 7/4008 |
| | | | | 342/118 |
| 2018/0181077 A1* | 6/2018 | Salle | ..................... | G04F 10/005 |

\* cited by examiner

DIGITAL SYNTHESIZER, COMMUNICATION UNIT AND METHOD THEREFOR

FIELD OF THE INVENTION

The field of the invention relates to a digital synthesizer having a digitally controlled oscillator in a digital phase locked loop circuit (DPLL), a communication unit and a method therefor. In particular, the field relates to an all-digital PLL (ADPLL) for a frequency modulated continuous wave (FMCW) radar device in order to maintain a constant ADPLL bandwidth.

BACKGROUND OF THE INVENTION

In many present day wireless communication applications, a digital synthesizer is used and often implemented by way of a digital phase locked loop (DPLL) that is used to control a digitally controlled oscillator (DCO) to generate (often referred to as 'synthesize') an output radio frequency (local oscillator) signal. Such digital synthesizers provide the benefit of simplifying the integration of the synthesizer circuitry within large scale integrated digital circuit devices, as compared with equivalent analogue synthesizers, thereby reducing size, cost, power consumption and design complexity. Furthermore, DPLLs intrinsically present lower phase noise than their analogue counterparts.

All-digital phase locked loops (ADPLLs) can be used as a frequency synthesizer in radio frequency circuits to create a stable local oscillator for transmitters or receivers, due to their low power consumption and high integration level. They can also be used to generate the frequency-modulated continuous wave (FMCW) waveforms required by a radar transmitter.

Modern FMCW radar systems require fast modulation ramps (with ramp-up times from 10 us to 100 us), but only process radar signals during ramp-up periods. Setting the ADPLL bandwidth is a delicate trade-off between good phase-noise (thus, low bandwidth) and high linearity of the FMCW ramps (thus, high bandwidth), and so the optimum bandwidth window is very narrow. In applications such as automotive radar systems, phase noise introduced into the output frequency signal by the synthesizer is a critical design factor.

As the DCO gain varies with frequency, say due to physical device behaviour, it also varies during the ramp modulation. This also causes the PLL bandwidth to vary, which may depart from the optimum bandwidth.

U.S. Pat. No. 7,466,207 B2 describes a way of measuring a value of a frequency gain ($K_{DCO}$) of a DCO in an ADPLL by using the loop itself, for a given frequency, and adapting the kdco_est. However, the algorithm in U.S. Pat. No. 7,466,207 B2 takes a long time to converge, and is therefore only practically useful for fixed frequency scenarios and, in effect, unusable for systems that employ a wide range of frequencies.

Accordingly, for such applications, it is important to maintain a very tight control on the ADPLL bandwidth, even during wide-frequency FMCW modulation ramps.

SUMMARY OF THE INVENTION

The present invention provides a digital synthesizer, a communication unit, such as a radar device, and a method therefor as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

In accordance with some example embodiments of the present invention, there is provided a digital synthesizer and a method of generating a digital oscillator signal. The value of the frequency gain ($K_{DCO}$) of a radio frequency (RF) oscillator, such as a digitally controlled oscillator (DCO), at any point in time, is a function of frequency as well as the current state of process, voltage and temperature (PVT). In examples of the invention, a digital synthesizer includes a modulation generator that generates not only frequency control words (FCW) that describe the wanted FMCW ramps, but concurrently generates a frequency-dependent gain (e.g. Fref/Kdco_est) that varies with the desired FCW signal to compensate for DCO gain variation of the digital synthesizer. In this manner, an open-loop gain is maintained as being substantially constant across a DCO operating frequency range (e.g. Fref/Kdco_est×Kdco is constant). For example, in some instances, the expression 'substantially constant' encompasses the open-loop gain being maintained within, say, a 10% gain range across a DCO operating frequency range.

Thus, in some examples the frequency-dependent gain is changed dynamically during the generation of FMCW radar ramps, in contrast to known ADPLLs that do not propose any frequency-dependent gain change during the generation of FMCW radar ramps. Known ADPLLs have rarely been used in FMCW radar systems, as yet, due to the extremely demanding phase-noise performances required, and also very demanding level of spurious signals that are needed, which are extremely difficult to attain with an ADPLL.

In some examples, a preliminary measurement of DCO gains, for example across DCO frequency extremes, may be performed, such that a (linear or polynomial) curve of Fref/$K_{DCO}$ may be applied by the gain circuit to track the DCO gain variations, after measurement of the extreme DCO gains.

Advantageously, such a frequency-dependent gain change, applied during the generation of FMCW radar ramps, may allow the digital synthesizer to generate modulation signals with a substantially constant ADPLL bandwidth across a frequency modulation bandwidth, even during fast and wide frequency sweeps.

Figure 1:
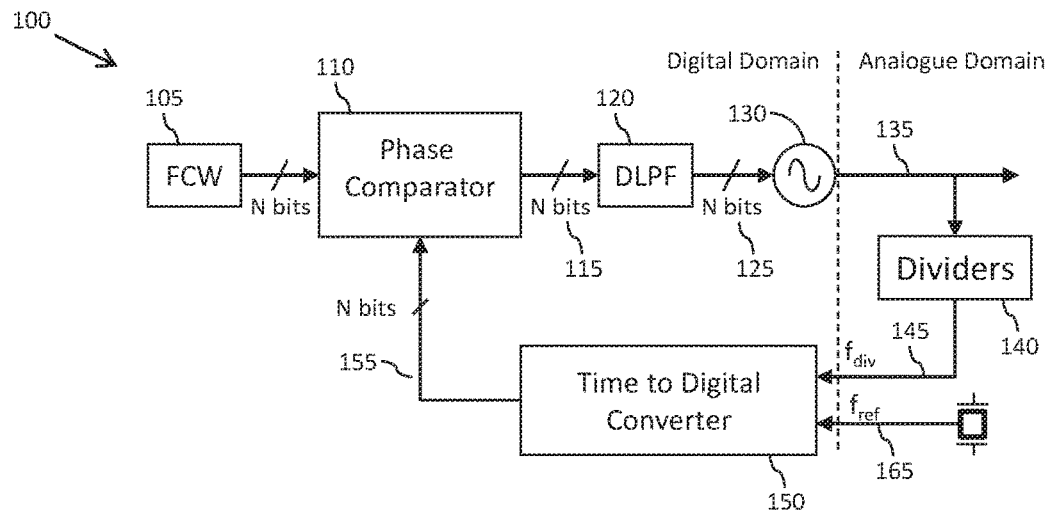
FIG. 1 illustrates a conventional digital phase locked loop design.

FIG. 1 illustrates a conventional digital phase locked loop (DPLL) 100. An N-bit digital FCW 105 is provided to a phase comparator 110, which compares an N-bit digital feedback signal 155 to the FCW 105, and outputs an N-bit oscillator control signal 115 based on the comparison of the digital feedback signal 155 to the FCW 105. A digital low pass filter 120 filters the N-bit oscillator control signal 115, and outputs a filtered N-bit oscillator control signal 125, which is provided to a digitally controlled oscillator (DCO) 130. The DCO 130 outputs a frequency signal 135 based on the filtered N-bit oscillator control signal 125. A feedback path of the DPLL 100 consists of a divider 140 that divides the output frequency signal 135 to generate a frequency-divided signal 145, which is provided to a time-to-digital converter (TDC) 150. The TDC 150 also receives a reference frequency signal 165, which is used to sample the frequency-divided signal 145. The TDC 150 outputs the N-bit digital feedback signal 155 based on a measured time interval between the frequency-divided signal 145 and the reference frequency signal 165.

The phase noise introduced by the DPLL 100 of FIG. 1 is primarily due to the digital-to-analogue conversion performed by the DCO 130, and time-to-digital conversion performed by the time to digital converter 150 in the feedback path. In particular, the minimum frequency resolution of the DCO 130 dictates the phase noise performance of the DPLL 100, since it introduces quantization noise on top of the intrinsic DCO noise performance.

Figure 2:
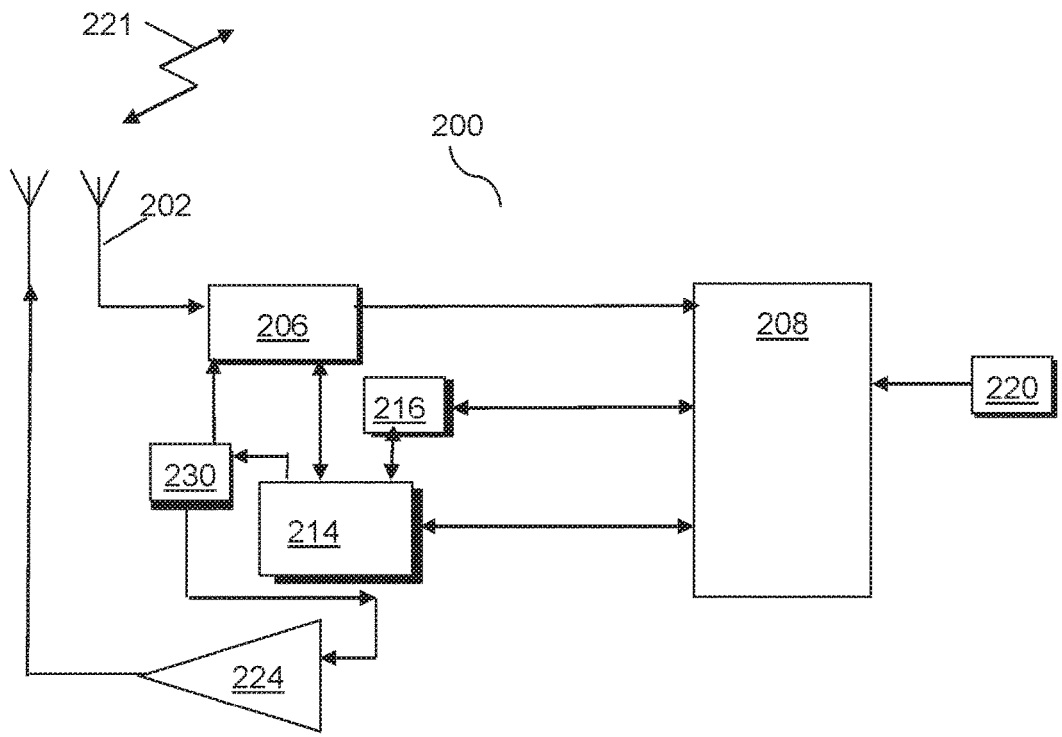
FIG. 2 illustrates a simplified block diagram of a radar device, adapted in accordance with examples of the invention.

Referring to FIG. 2, a block diagram of a wireless communication unit is shown, adapted in accordance with some examples of the invention. Purely for explanatory purposes, the wireless communication unit is described in terms of a radar device 200 operating at MMW frequencies. The radar device 200 contains one or several antennas 202 for receiving radar signals 221, and one or several antennas 203 for transmitting radar signals, with one shown for each for simplicity reasons only. The number of antennas 202, 203 used may depend on the number of radar receiver and transmitter channels that are implemented in a given radar device. One or more receiver chains, as known in the art, include receiver front-end circuitry 206, effectively providing reception, frequency conversion, filtering and intermediate or base-band amplification, and finally an analog-to-digital conversion. In some examples, a number of such circuits or components may reside in signal processing module 208, dependent upon the specific selected architecture. The receiver front-end circuitry 206 is coupled to the signal processing module 208 (generally realized by a digital signal processor (DSP)). A skilled artisan will appreciate that the level of integration of receiver circuits or components may be, in some instances, implementation-dependent.

The controller 214 maintains overall operational control of the radar device 200, and in some examples may comprise time-based digital functions (not shown) to control the timing of operations (e.g. transmission or reception of time-dependent signals, FMCW modulation generation, etc.) within the radar device 200. The controller 214 is also coupled to the receiver front-end circuitry 206 and the signal processing module 208. In some examples, the controller 214 is also coupled to a memory device 216 that selectively stores operating regimes, such as decoding/encoding functions, and the like.

As regards the transmit chain, this essentially comprises a power amplifier (PA) 224 coupled to the transmitter's one or several antennas 203, antenna array, or plurality of antennas. In radar device 200, radar transceiver topology is different from traditional wireless communication architectures (e.g. Bluetooth™, WiFi™, etc.), as modulation occurs within a phase locked loop (PLL) (typically via a fractional-N divider), and is applied directly to the PA 224. Therefore, in some examples, the receiver front-end circuitry 206 and transmitter PA 224 are coupled to frequency generation circuit 230 arranged to provide local oscillator signals. The generated local oscillator signals are thus modulated directly to generate transmit radar signals, and also used to down-convert received modulated radar signals to a final intermediate or baseband frequency or digital signal for processing in a receive operation.

Figure 3:
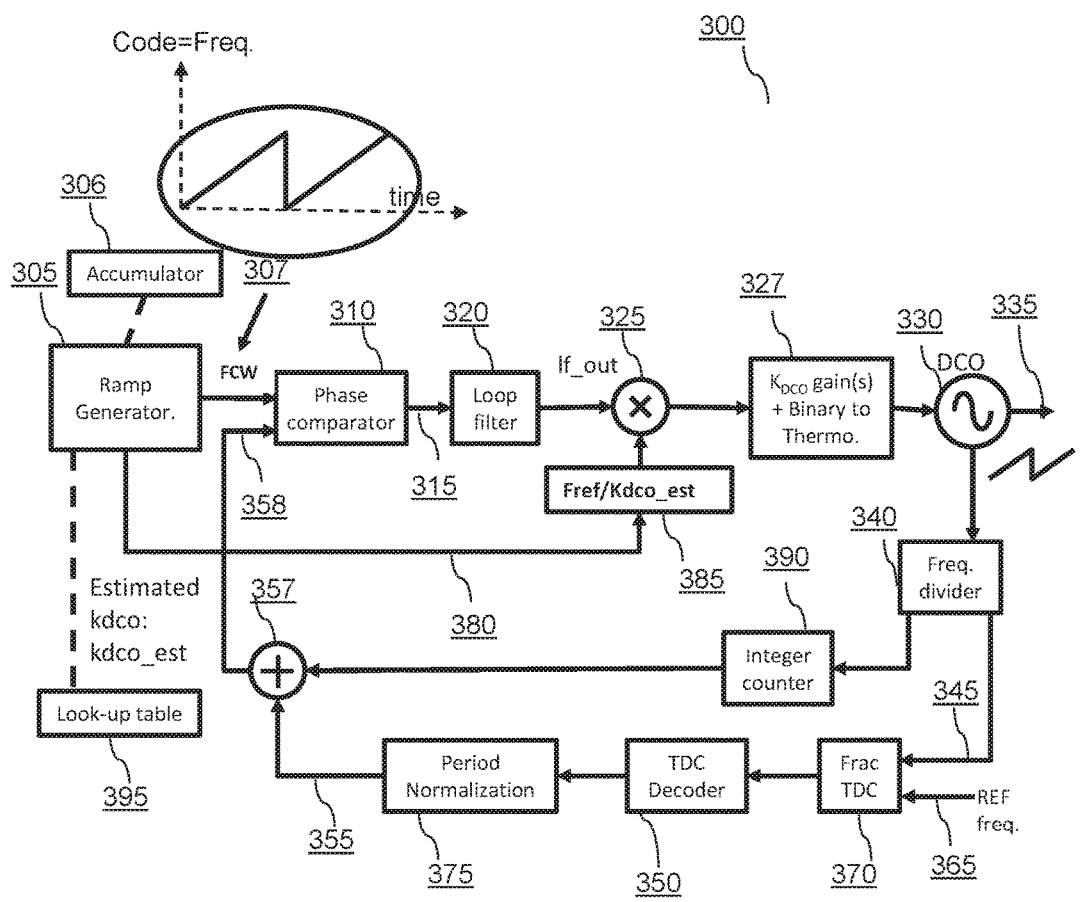
FIG. 3 illustrates a simplified circuit diagram of a first example of a digitally controlled oscillator in accordance with examples of the invention.
Figure 4:
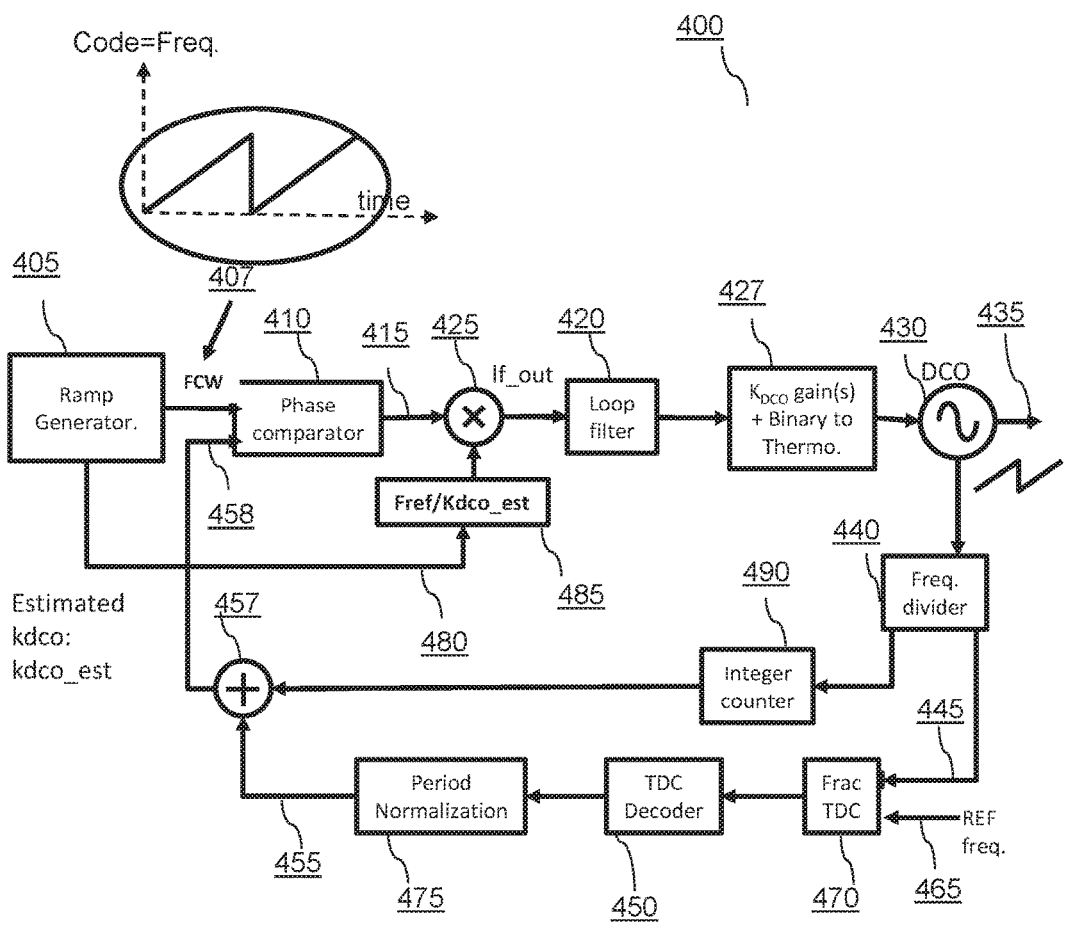
FIG. 4 illustrates a simplified circuit diagram of a second example of a digitally controlled oscillator in accordance with examples of the invention.

In accordance with examples of the invention, frequency generation circuit 230 includes a digital synthesizer comprising a digitally controlled oscillator, DCO; a feedback loop; a ramp generator configured to generate a signal of frequency control words, FCW, that describes a desired frequency modulated continuous wave; and a phase comparator configured to compare a phase of the FCW output from the ramp generator and a signal fed back from the DCO via the feedback loop and output a N-bit oscillator control signal, as described with reference to FIG. 3 and FIG. 4. The digital synthesizer includes a gain circuit coupled to a multiplier located between the ramp generator and the DCO and configured to apply a frequency-dependent gain signal to the N-bit oscillator control signal to maintain an open loop gain of the ADPLL and, thus, a PLL loop bandwidth that is substantially constant across a frequency modulation bandwidth.

In FIG. 2, a single processor may be used to implement a processing of receive signals. Clearly, the various components within the radar device 200 can be realized in discrete or integrated component form, with an ultimate structure therefore being an application-specific or design selection.

A skilled artisan will appreciate that the level of integration of circuits or components may be, in some instances, implementation-dependent.

FIG. 3 illustrates a simplified block diagram of a first example of a digital synthesizer, and more specifically a digital phase locked loop (DPLL) 300 that includes a digitally controlled oscillator (DCO) 330, in accordance with examples of the invention. In some examples, the DPLL may form part of the frequency generation circuit 230 of FIG. 2. In some examples, a modulation generator, which in the illustrated example is a ramp generator 305, is configured to generate not only frequency control words (FCW) 307 that describe the wanted frequency modulated continuous waveform (FMCW) ramps. At the same time, ramp generator 305 generates an estimated kdco value (kdco_est) 380 that is input to a gain circuit 385. Gain circuit 385 is configured to produce a gain value representing a Fref/Kdco_est, which varies with the desired FCW frequency in order to compensate for the DCO gain variation. In this manner, the open-loop gain is ~Fref/Kdco_est×Kdco, which is advantageously maintained as substantially constant across the ADPLL bandwidth.

In other examples, it is envisaged that circuits other than the modulation generator 305 may be used to provide the estimated kdco value (kdco_est) 380, which is ultimately applied to the FCW signal.

Thus, in the illustrated example, a ramp generator 305, generates an N-bit digital FCW signal 307 and provides the N-bit digital FCW signal 307 to a phase comparator 310, which compares an N-bit digital feedback signal 355 to the FCW signal 307, and outputs an N-bit oscillator control signal 315 based on the comparison of the digital feedback signal 358 to the FCW signal 307. A digital low pass filter 320 filters the output N-bit oscillator control signal 315, and outputs a filtered N-bit oscillator control signal to a digital multiplier 325, which multiples the N-bit oscillator control signal with the gain value representing a Fref/Kdco_est. In this manner, in contrast to known DPLLs, the gain of the multiplication of the signal at the output of the loop filter, which is controlled by the ramp signal generator, may be adapted during modulation to maintain a substantially constant open-loop gain across the ADPLL modulation bandwidth.

The multiplier then outputs the multiplied signal to the DCO 330 via a further gain circuit 327, which in this example is identified as a $K_{DCO}$ gain(s)+Binary to thermometer gain circuit, where $K_{DCO}$ is the DCO gain. In essence, this results in a multiplication of a fixed gain (Kdco) that comes from a calibration of the DCO, in order to track the DCO gain. Thereafter, a decoder converts binary code into thermometer code in order to control the DCO, as the DCO needs this type of data format.

The DCO 330 outputs a frequency signal 335 based on the filtered oscillator control signal output from the digital multiplier 325. A feedback path of the DPLL 300 consists of a frequency divider 340 that divides the output frequency signal 335 to generate a frequency-divided signal 345, which is provided to a fractional time-to-digital converter (TDC) 370. The fractional TDC 370 also receives a reference frequency signal 365 that is used to sample the frequency-divided signal 345. The fractional TDC 370 routes the digital feedback signal to a TDC decoder 350 that decodes the digital feedback signal and outputs the decoded digital feedback signal to a period normalisation circuit 375 configured to provide the result of the fractional TDC measurement normalized to a period of the DCO frequency-divided signal 345.

The fractional TDC result, once normalized to the DCO divided-down period 355, is input to an adder 357, where it is added with an output from an integer counter 390 that also receives the frequency-divided signal 345. The adder 357 outputs the digital signal 358, which consists of the integer and fractional ratio between the reference frequency and DCO frequency-divided signal 345 to the phase comparator 310.

In some examples, a DCO gain variation across the ADPLL bandwidth may be obtained during a pre-measurement phase, and thereafter the gain adjusted to be substantially constant across a DCO operating frequency range.

In one example, a series of preliminary measurements of DCO gains may be performed, which in some examples may be stored in a look-up table 395. In other examples, the series of preliminary measurements of DCO gains may be performed in, for example, a simple optional accumulator 306, which may be located in or coupled to the ramp generator 305. In this latter example, a simple accumulator may be used for a $1^{st}$ order fit. In other examples, the DCO gains generated by the ramp generator during frequency modulation can be generated in a more complex way than just a first order polynomial (accumulator), for example using a polynomial of order 3, 5 or more.

In one example, a shape of Kdco vs DCO control code is known, which is typically a priori known from a specification data sheet, as it depends on the physical characteristics of devices. Furthermore, in this measurement phase, the DCO gain may be measured by settings of, say, two different DCO control codes (where the difference is known) and measuring a consequent difference between the DCO frequency (e.g. with a digital counter). Although not shown in the figure, this is one example technique to calculate Kdco as a delta frequency over delta code. In some examples, this may be performed outside of the PLL loop, for example during, say a start-up calibration phase before the PLL can lock.

In this pre-measurement phase, an accurate, known reference frequency, such as a crystal oscillator reference frequency, may be used. A measured Kdco value, equating to a delta frequency over a delta code, is performed for each Kdco value needed (so twice in this two-frequency example).

FIG. 4 illustrates a simplified circuit diagram of a second example of a digital synthesizer, and more specifically a digital phase locked loop (DPLL) 400 that includes a DCO 430, in accordance with examples of the invention. In this second example, the gain Fref/kdco_est is located before the loop filter 420, so that the potential transient changes in Fref/kdco_est would be filtered by the loop-filter 420 and would not disturb the loop.

Again, in this example, a modulation generator, which in the illustrated example is a ramp generator 405, is configured to generate frequency control words (FCW) 407 that describe the wanted frequency modulated continuous waveform (FMCW) ramps. At the same time, ramp generator 405 generates an estimated kdco value (kdco_est) 480 that is input to a gain circuit 485. Gain circuit 485 is configured to produce a gain value representing a Fref/Kdco_est, which varies with the desired FCW frequency in order to compensate for the DCO gain variation. In this manner, the open-loop gain is ~Fref/Kdco_est×Kdco, which is constant across the ADPLL bandwidth.

In other examples, it is envisaged that the estimated kdco value (kdco_est) 480 may be computed in real time during a frequency modulation process, for example by a circuit (not shown) using the control code to the DCO 430 derived at the output of the loop filter 420. In a yet further alternative, the estimated kdco value (kdco_est) 480 may be computed inside the Kdco gain circuit 426, namely after the DCO gain but before binary-to-thermometer decoder, which also contains information of DCO control code, from which Kdco_est 480 may be extracted.

Thus, in the illustrated example, a ramp generator 405, generates an N-bit digital frequency control word 407 and provides the N-bit digital frequency control word 407 to a phase comparator 410, which compares an N-bit digital feedback signal 458 to the frequency control word 407, and outputs an N-bit oscillator control signal 415 based on the comparison of the digital feedback signal 458 to the frequency control word 407. The N-bit oscillator control signal 415 is output to a digital multiplier 425, which multiples the N-bit oscillator control signal with the gain value representing a Fref/Kdco_est. In this manner, in contrast to known DPLLs, the gain of the multiplication of the ramp signal may be adapted during modulation to maintain a substantially constant open-loop gain across the ADPLL modulation bandwidth. In this example, the intermediate frequency output from the digital multiplier 425 is filtered by a digital low pass filter 420.

It is envisaged that, in other examples, the digital multiplier 425 may be located anywhere between an output of phase comparator 410 and an input of the DCO 430.

The multiplier then outputs the multiplied signal to DCO 430 via a gain circuit 427, which in this example is identified as a $K_{DCO}$ gain(s) together with a decoder converts binary code into thermometer code in order to control the DCO, as the DCO needs this type of data format.

The DCO 430 outputs a frequency signal 435 based on the filtered oscillator control signal output from the digital multiplier 425. A feedback path of the DPLL 400 consists of a frequency divider 440 that divides the output frequency signal 435 to generate a frequency-divided signal 445, which is provided to a fractional time-to-digital converter (TDC) 470. The fractional TDC 470 also receives a reference frequency signal 465 that is used to sample the frequency-divided signal 445. The fractional TDC 470 generates the digital feedback signal to a TDC decoder 450 that decodes the digital feedback signal and outputs the decoded digital feedback signal to a period normalisation circuit 475 configured to produce an appropriately sampled frequency-divided signal 455.

The appropriately sampled frequency-divided signal 455 is input to a second multiplier 457, where it is multiplied with an output from an integer counter 490 that also receives the frequency-divided signal 445. The second multiplier 457 outputs the digital feedback signal 458 to the phase comparator 410.

In some examples, a DCO gain variation across the ADPLL bandwidth may be obtained during a pre-measurement phase.

In one example, a series of preliminary measurements of DCO gains may be performed, which in some examples may be stored in a look-up table 495. In other examples, the series of preliminary measurements of DCO gains may be performed in, for example, a simple optional accumulator 406, which may be located in or coupled to the ramp generator 405. In this latter example, a simple accumulator may be used for a $1^{st}$ order fit. In other examples, the DCO gains generated by the ramp generator during frequency modulation can be generated in a more complex way than just a first order polynomial (accumulator), for example using a polynomial of order 3, 5, or higher.

In one example, a shape of KDCO vs DCO control code is known, which is typically a priori known from a specification data sheet, as it depends on the physical characteristics of devices. Furthermore, in this measurement phase, the DCO gain may be measured by settings of, say, two different DCO control codes (where the difference is known) and measuring a consequent difference between the DCO frequency (e.g. with a digital counter). Although not shown in the figure, this is one example technique to calculate Kdco as a delta frequency over delta code. In some examples, this may be performed outside of the PLL loop, for example during, say a start-up calibration phase before the PLL can lock.

In this measurement phase, an accurate, known reference frequency, such as a crystal oscillator reference frequency, may be used. A measured Kdco value, equating to a delta frequency over a delta code, is performed for each Kdco value needed (so twice in this two-frequency example).

Figure 5:
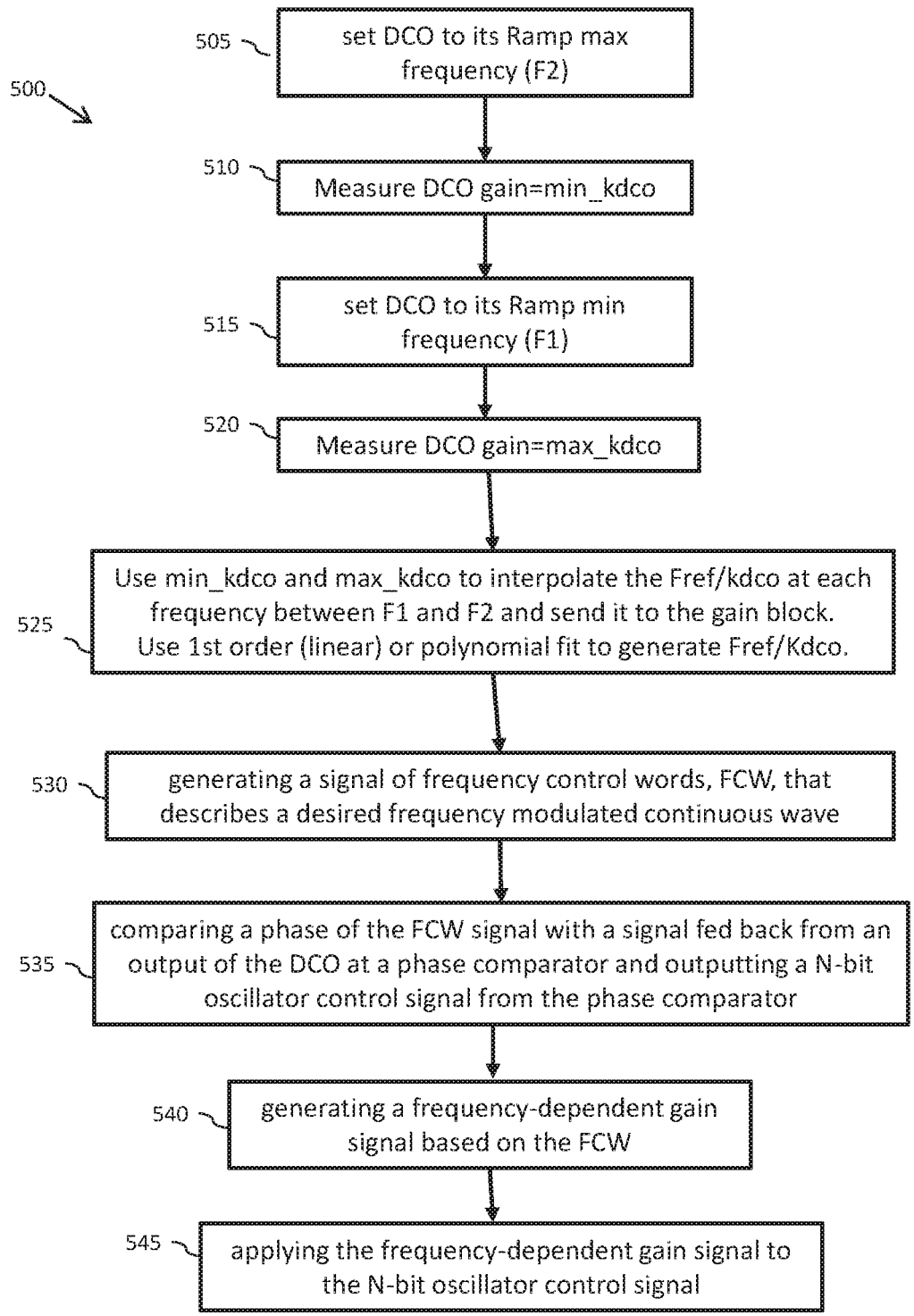
FIG. 5 illustrates a simplified flowchart of an example of a method of controlling a digitally controlled oscillator to provide a substantially constant bandwidth.

Referring now to FIG. 5, a simplified flowchart 500 of an example of a method of configuring a DCO, to provide a substantially constant gain across a DCO operating frequency range or bandwidth, is illustrated. The flowchart describes one example of a first measurement phase that can be employed in the circuits of FIG. 3 or FIG. 4, in order to pre-configure the gain versus frequency components and circuits of the ADPLL.

At 505, the DCO frequency is set to, say, a maximum ramp max frequency (F2). At 510, a DCO gain, which is equivalent to a min_kdco value, is measured. At 515, a DCO frequency is set to its minimum ramp min frequency (F1). At 520, the DCO gain, which is equivalent to a max_kdco is measured. At 525, the measured min_kdco and max_kdco are then used to interpolate the Fref/kdco at each frequency between F1 and F2. In one example, these interpolated values are then send to the gain circuits 385, 485. In some examples, the gain circuit 385 of FIG. 3, or gain circuit 485 of FIG. 4 may be configured to, say, use a first order (linear) or polynomial fit, in order to generate Fref/Kdco values. In effect, as would be appreciated by a skilled artisan, the frequency where the $K_{DCO}$ measurements occur may be F1/F2 or the max/min frequency covered by the DCO 330, 430.

Although this example of a first measurement phase has proposed setting a maximum and minimum frequency (F1 and F2) and measuring the DCO gain value at these frequencies (equivalent to a min_kdco and max_kdco values), it is envisaged that other gain calibration mechanisms, algorithms and circuits may be used to achieve the details of the gain versus frequency relationship.

Referring back to the flowchart 500, a second phase that maintains an open loop gain of an ADPLL and, thus, a PLL loop bandwidth that is substantially constant across a frequency modulation bandwidth, is illustrated. The second phase comprises, at 530, generating a signal of frequency control words, FCW, which describes a desired frequency modulated continuous wave. At 535, the a phase of the FCW signal is compared with a signal that is fed back from an output of the DCO at a phase comparator and a N-bit oscillator control signal is output from the phase comparator. At 540, a frequency-dependent gain signal is generated based on the FCW; and the frequency-dependent gain signal applied to (e.g. multiplied with) the N-bit oscillator control signal.

In examples of the invention, it can be seen that the gain response is shaped whilst the frequency is being ramped up in order to keep a very tight control on the ADPLL bandwidth even during wide frequency FMCW modulation ramps. The shape of Kdco versus DCO control code is known, which is generally the case as this relationship depends on the physical characteristics of the devices. Consequently, as the relationship of Kdco vs DCO control code is known, then the Ramp generator, which generates the DCO codes, can also generate the Fref/Kdco_est ratio 485.

Figure 6:
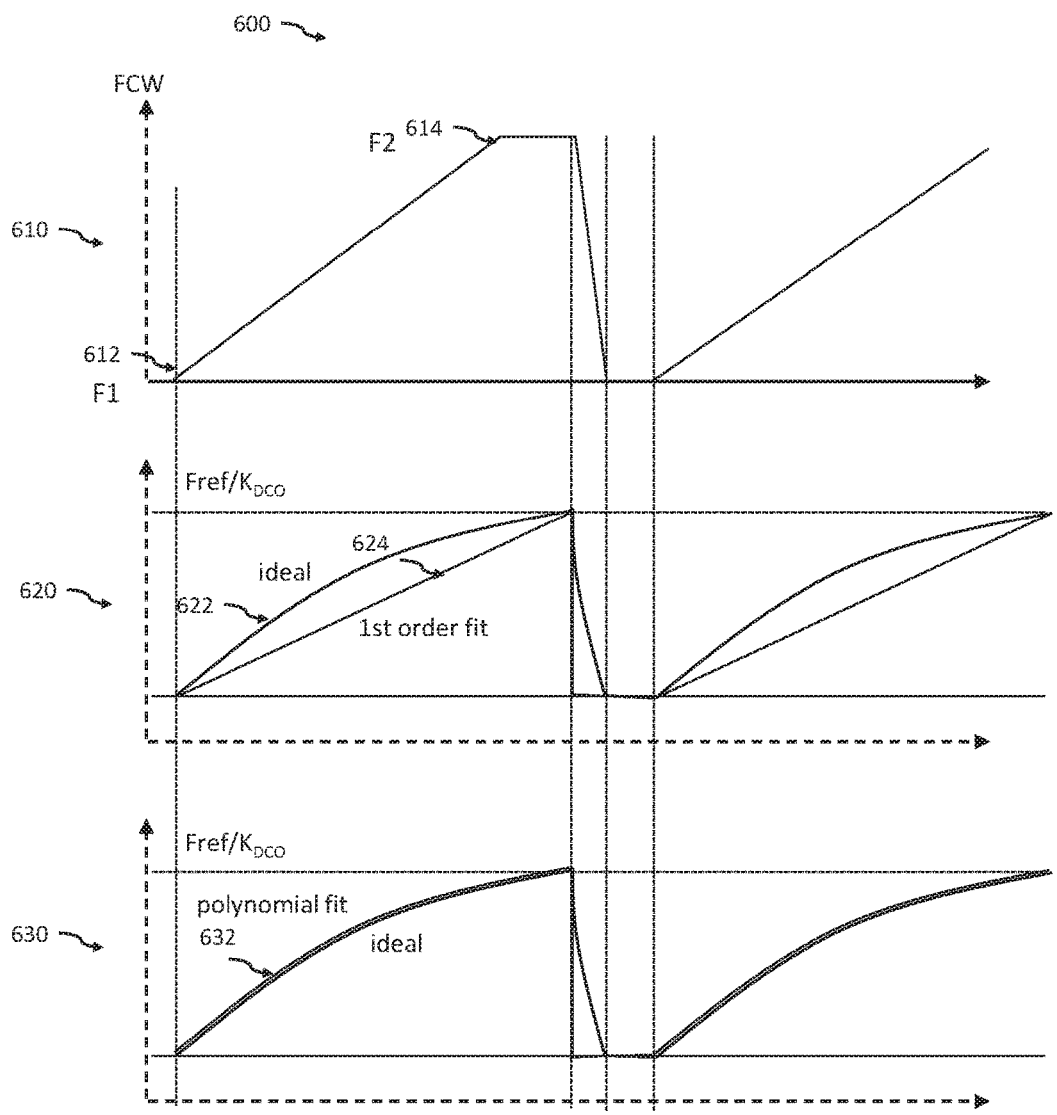
FIG. 6 illustrates example waveforms associated with the flowchart of FIG. 5.

FIG. 6 illustrates example waveforms 600 associated with the flowchart of FIG. 5. The example in FIG. 5 proposed a ramp between two frequencies, with the ramp between the two frequencies (F1) 612 and (F2) 614, used for example during a measurement phase, illustrated in a first waveform 610. In this example, the two points Fref/Kdco related to these two frequencies are known. Hence, it is easy to interpolate between them with a line or polynomial fit. A second set of waveforms 620 illustrate an ideal transition 622 versus a first order polynomial fit 624. A third set of waveforms 630 illustrates a polynomial fit 632, which is an improvement on the first order fit 624.

In some examples, it is envisaged that this measurement should be re-done, if F1 or F2 change. Therefore, the validity of the measurement is dependent upon what the user of the device, say, a radar device, is doing with the frequency modulation, and a new operating frequency or frequency range is adopted, the measurement phase may need to be re-done.

In an alternative example, if minimum and maximum DCO frequencies are used to measure Kdco, the Kdco may be known (or at least a reasonable approximation made) for all the possible frequencies that the user may use. Thus, this example may be perceived as more versatile. However, this example may be quite different from F1/F2, so the fit may be less accurate for Kdco_est calculation. Thus, in some examples, a trade-off between versatility and accuracy of fit may be employed.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

Furthermore, because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented that achieve the same functionality.

Any arrangement of components to achieve the same functionality is effectively 'associated', such that the desired functionality is achieved. Hence, any two components herein combined to achieve a particular functionality can be seen as being 'associated with' each other, such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations are merely illustrative. The multiple operations may be executed at least partially overlapping in time. Moreover, alternative example embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in wireless programmable devices or units able to perform the desired device functions by operating in accordance with suitable program code.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one, or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A digital synthesizer comprising:
   a digitally controlled oscillator, DCO;
   a feedback loop;
   a ramp generator configured to generate a signal of frequency control words, FCW, that describes a desired frequency modulated continuous wave; and
   a phase comparator configured to compare a phase of the FCW output from the ramp generator and a signal fed back from the DCO via the feedback loop and output a N-bit oscillator control signal;
   wherein
      the digital synthesizer comprises a gain circuit coupled to a multiplier located between the ramp generator and the DCO and configured to apply a frequency-dependent gain signal to the N-bit oscillator control signal to maintain an open loop gain of the all-digital phase locked loop, ADPLL, and a PLL loop bandwidth that is substantially constant across a frequency modulation bandwidth, the open loop gain variations are controlled according to predefined DCO gain variations determined across a range of DCO frequencies, and the predefined DCO gain variations determined across a range of DCO frequencies are obtained through measurements of DCO gains.

2. The digital synthesizer of claim 1, wherein the frequency-dependent gain is represented by $K_{DCO}$ and the gain circuit applies a reference frequency/Kdco_est gain to the N-bit oscillator control signal to compensate for a DCO gain variation.

3. The digital synthesizer of claim 1, wherein the gain circuit applies the frequency-dependent gain dynamically during a generation of frequency modulated continuous wave radar ramp-up signals.

4. The digital synthesizer of claim 1, wherein the multiplier is configured to multiply the N-bit oscillator control signal with a concurrently generated gain signal that is representative of a curve of a reference frequency divided by the frequency-dependent gain represented by $K_{DCO}$.

5. The digital synthesizer of claim 4, wherein the curve is a linear curve or polynomial curve.

6. The digital synthesizer of claim 1, wherein the predefined DCO gain variations determined across a range of DCO frequencies are stored in a look-up table coupled to the digital synthesizer.

7. The digital synthesizer of claim 1, wherein the predefined DCO gain variations determined across a range of DCO frequencies are obtained through measurements of DCO gains and applied using an odd order polynomial that is located in, or coupled to, the ramp generator.

8. The digital synthesizer of claim 1, wherein the digital multiplier is located anywhere between an output of the phase comparator and an input of the DCO.

9. The digital synthesizer of claim 1, further comprising a loop filter located between the phase comparator and multiplier and configured to filter the N-bit oscillator control signal before inputting the filtered N-bit oscillator control signal to the multiplier.

10. The digital synthesizer of claim 1, further comprising a loop filter located after the multiplier, such that the multiplier is directly coupled to the phase comparator and the loop filter is configured to filter the N-bit oscillator control signal multiplied with the frequency-dependent gain signal.

11. A communication unit having a digital synthesizer comprising:
    a digitally controlled oscillator, DCO;
    a feedback loop;
    a ramp generator configured to generate a signal of frequency control words, FCW, that describes a desired frequency modulated continuous wave; and
    a phase comparator configured to compare a phase of the FCW output from the ramp generator and a signal fed back from the DCO via the feedback loop and output a N-bit oscillator control signal;
    wherein
        the digital synthesizer comprises a gain circuit coupled to a multiplier located between the ramp generator and the DCO and configured to apply a frequency-dependent gain signal to the N-bit oscillator control signal to maintain an open loop gain of the all-digital phase locked loop, ADPLL, and a PLL loop bandwidth that is substantially constant across a frequency modulation bandwidth,
        the open loop gain variations are controlled according to predefined DCO gain variations determined across a range of DCO frequencies, and
        the predefined DCO gain variations determined across a range of DCO frequencies are obtained through measurements of DCO gains.

12. A method for maintaining an open loop gain of an all-digital phase locked loop, ADPLL, as substantially constant across a frequency modulation bandwidth, the method comprising:
    generating a signal of frequency control words, FCW, that describes a desired frequency modulated continuous wave;
    comparing a phase of the FCW signal with a signal fed back from an output of a digital controlled oscillator, DCO, at a phase comparator and outputting a N-bit oscillator control signal from the phase comparator;
    generating a frequency-dependent gain signal based on the FCW; and
    applying the frequency-dependent gain signal to the N-bit oscillator control signal to maintain an open loop gain of the all-digital phase locked loop, ADPLL, wherein the open loop gain variations are controlled according to predefined DCO gain variations determined across a range of DCO frequencies, and the predefined DCO gain variations determined across a range of DCO frequencies are obtained through measurements of DCO gains.

13. The method of claim 12, the method further comprising applying the frequency-dependent gain dynamically during a generation of frequency modulated continuous wave radar ramps.

14. The method of claim 12 further comprising:
    applying at least a first frequency to the DCO and measuring a first open loop gain value;
    applying at least a second frequency to the DCO and measuring a second open loop gain value; and
    determine therefrom open loop gain values across a range of frequency modulation bandwidths.

* * * * *